(12) United States Patent
Asauchi

(10) Patent No.: US 7,433,260 B2
(45) Date of Patent: Oct. 7, 2008

(54) MEMORY DEVICE AND PRINT RECORDING MATERIAL RECEPTACLE PROVIDING MEMORY DEVICE

(75) Inventor: Noboru Asauchi, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 192 days.

(21) Appl. No.: 11/516,941

(22) Filed: Sep. 6, 2006

(65) Prior Publication Data

US 2007/0016734 A1 Jan. 18, 2007

Related U.S. Application Data

(63) Continuation of application No. PCT/JP2005/022911, filed on Dec. 7, 2005.

(30) Foreign Application Priority Data

Dec. 14, 2004 (JP) ............................. 2004-360787

(51) Int. Cl.
*G11C 8/00* (2006.01)
(52) U.S. Cl. ............... 365/230.05; 365/195; 365/233.1; 365/239
(58) Field of Classification Search ................. 365/195, 365/230.05, 233.1, 233.11, 233.12, 239, 365/230.03; 711/154, 156; 347/19, 86
See application file for complete search history.

(56) References Cited

U.S. PATENT DOCUMENTS

| 7,031,012 B1 * | 4/2006 | Serizawa ................... 358/1.16 |
| 2007/0165482 A1 * | 7/2007 | Asauchi ....................... 365/239 |

FOREIGN PATENT DOCUMENTS

| JP | 10-302485 A | 11/1998 |
| JP | 2001-166649 A | 6/2001 |
| JP | 2004-242891 A | 9/2004 |

OTHER PUBLICATIONS

International Search Report from PCT Patent Appln. PCT/JP2005/022911, dated Jan. 17, 2006.
English Translation of the Written Opinion of the International Searching Authority in appln. No. PCT/JP2005/022911 (Jun. 28, 2007).

\* cited by examiner

*Primary Examiner*—Son Dinh
*Assistant Examiner*—Hien N Nguyen
(74) *Attorney, Agent, or Firm*—Stroock & Stroock & Lavan LLP

(57) ABSTRACT

The operation code decoder 204 having received an access enable signal EN acquires and decodes the command, and sends the decoded command to the read/write controller 206. In the event that the received command is a write command, the read/write controller 206 acquires access control information from the fourth address following the head address of the memory array 201. In the event that the acquired access control information indicates that write operations are prohibited, the read/write controller 206 does not send the write command received from the operation code decoder 204 to the I/O controller 205.

13 Claims, 10 Drawing Sheets

MEMORY DEVICE AND PRINT RECORDING MATERIAL RECEPTACLE PROVIDING MEMORY DEVICE

CROSS-REFERENCE TO RELATED APPLICATION

This application is a continuation of international application no. PCT/JP2005/022911, filed on Dec. 7, 2005.

FIELD OF THE INVENTION

The present invention relates to a memory device for interconnection with a bus, and more particularly to technology for controlling access to a memory device.

BACKGROUND ART

Known technologies for controlling access (writing of data to) memory devices include a technology whereby a device for preventing write operations to a memory device is grounded outside the memory device. In another known technology, information disallowing write operations to a data memory area is written to an address after the data memory area, thereby prohibiting further write operations to the data memory area.

However, where a device for preventing write operations is provided outside the memory device, it was necessary to provide the external write prevention device in addition to the memory device. In technology permitting settings to be made to enable or disable access to data memory areas, some time is needed for the determination as to whether writing to a data memory area is enabled or disabled, and there was always the risk that a data memory area might be written to inadvertently during the write enable/disable determination process. There was also the risk that settings prohibiting access to an entire data memory area of a memory device might not be made appropriately.

DISCLOSURE OF THE INVENTION

With the foregoing in view, it is an object of the present invention to attain rapid access control to a memory array in a memory device, as well as to control access so that the memory array is not written to inadvertently.

In order to address this issue, a first aspect of the invention provides a memory device accessed sequentially starting from a head address. The memory device of the first aspect of the invention comprises: a nonvolatile memory array that stores at an address accessed prior to the data storage start address access control information indicating whether data write operations to the memory device are enabled or disabled; a receiving module that receives an access request that includes either a write request or a read request to the memory array; and an access control module that, in the event that the access request is a write request to the memory array, refers to the access control information in the memory array, and in the event that write operations are not allowed, does not execute the received access request.

According to the memory device of the first aspect of the invention, when a received access request is a request to write to the memory array, reference is made to access control information in the memory array, and in the event that write operations are not allowed, the received access request is not executed, whereby control of access to the memory array of the memory device may be executed rapidly, and inadvertent writing to the memory array may be avoided.

In the memory device of the first aspect of the invention, the address at which the access control information is stored may be the fourth address after the head address; and
the access control module may comprise:
an input/output control module that performs writing of data to the memory array and reading of data from the memory array; a command decoder that parses write/read commands contained in access requests input via the receiving module; and a read/write control module that, in the event that the command parse result by the command decoder is a write command, refers to the access control information in the memory array, and in the event that write operations are not allowed, does not send the received write command to the input/output control module.

According to this arrangement, in the event that the command parse result by the command decoder is a write command, reference is made to access control information in the memory array, and in the event that write operations are not allowed, the received write command is not sent to the input/output control module, whereby control of access to the memory array of the memory device may be executed rapidly, and inadvertent writing to the memory array may be avoided.

In the memory device of the first aspect of the invention, the memory array may store, up to the third address starting from the head address, identifying information for the purpose of identifying the memory device; the access request may further include memory device identifying information specifying the memory device; and
the memory device may further comprise an ID comparator that acquires the identifying information from the memory device and decides whether the acquired identifying information matches the memory device identifying information contained in the received access request; wherein in the event that the identifying information matches the memory device identifying information, the ID comparator sends to the command decoder an enable signal enabling parsing of the command contained in the access request.

According to furnishing the above arrangement, it is possible to enable access exclusively to an intended memory device. Particularly where multiple memory devices are provided, it is possible to specify an intended memory device to be accessed for a read or write operation, from among the multiple memory devices.

In the memory device of the first aspect of the invention,
the receiving module may comprise a clock signal terminal that receives a clock signal for the purpose of identifying an address in the memory array; a data terminal for the purpose of data input and output; and a reset signal terminal that receives a reset signal; and
the memory device may further comprise a data bus connected to the data terminal; and an address counter that counts up a counter value in sync with the received clock signal, identifying addresses in the memory array; and that resets the counter value to an initial value during initialization.

A second aspect of the invention provides a memory device accessed sequentially starting from a head address. The memory device of the second aspect of the invention comprises: a nonvolatile memory array that stores at up to the third address starting from the head address identifying information for the purpose of identifying the memory device, and storing at the fourth address following the head address access control information indicating whether data write operations to the memory device are enabled or disabled; a clock signal terminal that receives a clock signal for the purpose of identifying an address in the memory array; a data terminal for input and output of a data sequence; a reset signal terminal that receives a reset signal; a data bus connected to the data terminal; an address counter that counts up a counter value in sync with the received clock signal, identifying addresses in the memory array, and that resets the counter value to an initial value during initialization; an ID comparator connected to the data bus, that decides whether memory device identifying information contained in the data sequence matches identifying information stored in the memory array, wherein in the event that the memory device identifying information matches the identifying information, the ID comparator outputs an enable signal enabling parsing of the command contained in the data sequence; an input/output control device located between the memory array and the data terminal, that in response to the received command controls the direction of data transfer with respect to the memory array and the direction of data transfer with respect to the data bus, and that until receiving the command, sets the direction of data transfer with respect to the memory array to the data read direction, and blocks connection to the data bus; a command decoder connected to the data bus and the ID comparator, that upon having received the enable signal from the ID comparator, parses the command contained in the data sequence; and a read/write control module that, in the event that the command parse result by the command decoder is a write command, refers to the access control information in the memory array, and in the event that write operations are not allowed, does not send the received write command to the input/output control module.

According to the memory device of the second aspect of the invention, when the command parse result is a write command, reference is made to access control information in the memory array, and in the event that write operations are not allowed, the received write command is not sent to the input/output control module, whereby control of access to the memory array of the memory device may be executed rapidly, and inadvertent writing to the memory array may be avoided.

A third aspect of the invention provides a print recording material receptacle comprising the memory device of the first or second aspect of the invention. According to the print recording material receptacle of the third aspect of the invention, there is provided a print recording material receptacle comprising a memory device whereby control of access to data memory areas may be executed rapidly, and inadvertent writing to data memory areas may be avoided.

In the print recording material receptacle according to the third aspect of the invention, the print recording material receptacle may comprise a memory device having different identifying information for each of a number of different ink types, corresponding to the ink type contained therein. In the case, it will be possible by means of the identifying information to identify the ink type contained within the print recording material receptacle.

A fourth aspect of the invention provides a memory device accessed sequentially in memory cell units starting from an access start location. The memory device of the fouth aspect of the invention comprises: a nonvolatile memory array furnished with a plurality of memory cells, and storing in the three memory cells following the lead one identifying information for the purpose of identifying the memory device, while storing in the fourth memory cell following the lead one access control information indicating whether data write operations to the memory device are enabled or disabled; a receiving module that receives an access request to the memory device; and an access control module that, in the event that the access request contains a write request, refers to the access control information in the memory array, and in the event that write operations are not allowed, does not execute the received access request.

According to the memory device of the fourth aspect of the invention, when a received access request contains a write request, reference is made to access control information in the memory array, and in the event that write operations are not allowed, the received access request is not executed, whereby control of access to the memory array of the memory device may be executed rapidly, and inadvertent writing to the memory array may be avoided.

A fifth aspect of the invention provides a method of making a memory device read-only, the memory device being a sequentially accessed device having prescribed data stored therein. The method of making a memory device read-only according to the fifth aspect of the invention comprises: detecting a reset signal in order to reset the counter value of an address counter to an initial value, while prohibiting countup of the counter value in sync with a clock signal; on the basis of a write command sent to a data bus, setting the data transfer direction with respect to the data bus to the write direction, while setting the data transfer direction with respect to the memory array to the write direction; upon completion of setting of the data transfer direction, permitting countup of the counter value in the address counter in sync with the clock signal; and in accordance with the count value of the address counter, writing data starting from the next address following the head address in a prescribed sequence, and finally writing at an address in the prescribed sequence following the head address access control information that prohibits further write operations.

According to the method of the fifth aspect of the invention, a read-only memory device is manufactured by means of writing data starting from the next address following the head address in a prescribed sequence, and finally writing at an address in the prescribed sequence following the head address access control information that prohibits further write operations, whereby it is possible to manufacture a memory device wherein control of access to the memory array may be executed rapidly, and inadvertent writing to the memory array may be avoided.

In the method of the fifth aspect of the invention, the access control information may be written to the fourth address following head address, and the manufacturing method may further comprise the step of writing identifying information up to the third address starting from the head address of the memory device, in accordance with the count value in the address counter.

A sixth aspect of the invention provides a method of making a nonvolatile memory device read-only, the memory device having a sequentially accessed memory array, and having stored at the fourth location following the lead location of a memory area of the memory array access control information indicating whether write operations are enabled or disabled. The method of the sixth aspect of the invention comprises: searching for identifying information that matches the identifying information stored in the memory array of the memory device; in the event that identifying information matching the identifying information stored in the memory array of the memory device is found, sending the found identifying information and a write command to the memory device; following the write data corresponding to the end location of the memory area of the memory array, sending to the memory device a data sequence that contains the identifying information and access control information; and in accordance with the count value in an address counter, writing data up to the end location of the memory area of the memory array, then writing access control information that prohibits further write operations, to the fourth location following the lead location of the memory area of the memory array.

According to the method of the sixth aspect of the invention, data is written up to the end location of a memory area of the memory array, and then access control information prohibiting further write operations is written to the fourth location following the lead location of the memory area of the memory array, whereby it is possible to manufacture a memory device wherein control of access to the memory array may be executed rapidly, and inadvertent writing to the memory array may be avoided.

A seventh aspect of the invention provides a memory system comprising a plurality of nonvolatile memory devices bus-connected to a clock signal line, a data signal line, and a reset signal line; and a control device connected to memory devices via a clock signal line, a data signal line, and a reset signal line. In the memory system of the seventh aspect of the invention, the control device comprises:

a clock signal generating circuit; a reset signal generating circuit that generates a reset signal for initializing the memory devices; an identifying information issuing circuit that issues identifying information corresponding to identifying information for a desired memory device among the plurality of memory devices; and a data transmission circuit that in sync with the generated clock signal, sends a data sequence containing the issued identifying information and a write/read command to the data signal line;

and each memory device comprises:

a data bus connected to the data signal line; a memory array that is accessed sequentially, and that at a prescribed location following the lead location of the memory area stores access control information indicating whether data write operations are enabled or disabled; an ID comparator connected to the data bus, that decides whether identifying information sent from the control device matches identifying information stored in the memory array; an input/output control device located between the memory array and the data bus, that in response to a received command controls data transfer with respect to the data bus and the memory array; a command decoder connected to the data bus and the ID comparator comparing device, and that in the event of a determination that identifying information sent from the control device by the comparing device matches the identifying information stored in the memory array, parses the write/read command contained in the data sequence; and a read/write control module located between the input/output control device and the command decoder, and that in the event that the parsed command is a write command, refers to the access control information in the memory array, and in the event that write operations are not allowed, does not send the write command to the input/output control module.

According to the memory system of the seventh aspect of the invention, it is possible to manufacture a memory device wherein control of access to the memory array may be executed rapidly, and inadvertent writing to the memory array may be avoided.

In the memory system of the seventh aspect of the invention, the memory device may further comprise an address counter that counts up a counter value in sync with a clock signal input via the clock signal line, identifying a location to be accessed in a memory area of the memory cell; and that resets the counter value to an initial value during initialization;

and during initialization the input/output control device may set the data transfer direction with respect to the memory array to the read direction and blocks data transfer with respect to the data bus, and maintain the initialization state unit parsing of the write/read command by the command decoder is complete.

By means of furnishing the above arrangement, during the decision as to whether identifying information belonging to a memory device matches input identifying information, the system may be maintained in state enabling read-only of identifying information stored in the memory array, with data write operations to the memory array being disabled.

BEST MODES OF CARRYING OUT THE INVENTION

A memory system comprising the memory device of the invention, and a method for manufacturing a memory device, shall be described hereinbelow through an embodiment with reference to the accompanying drawings.

Figure 1:
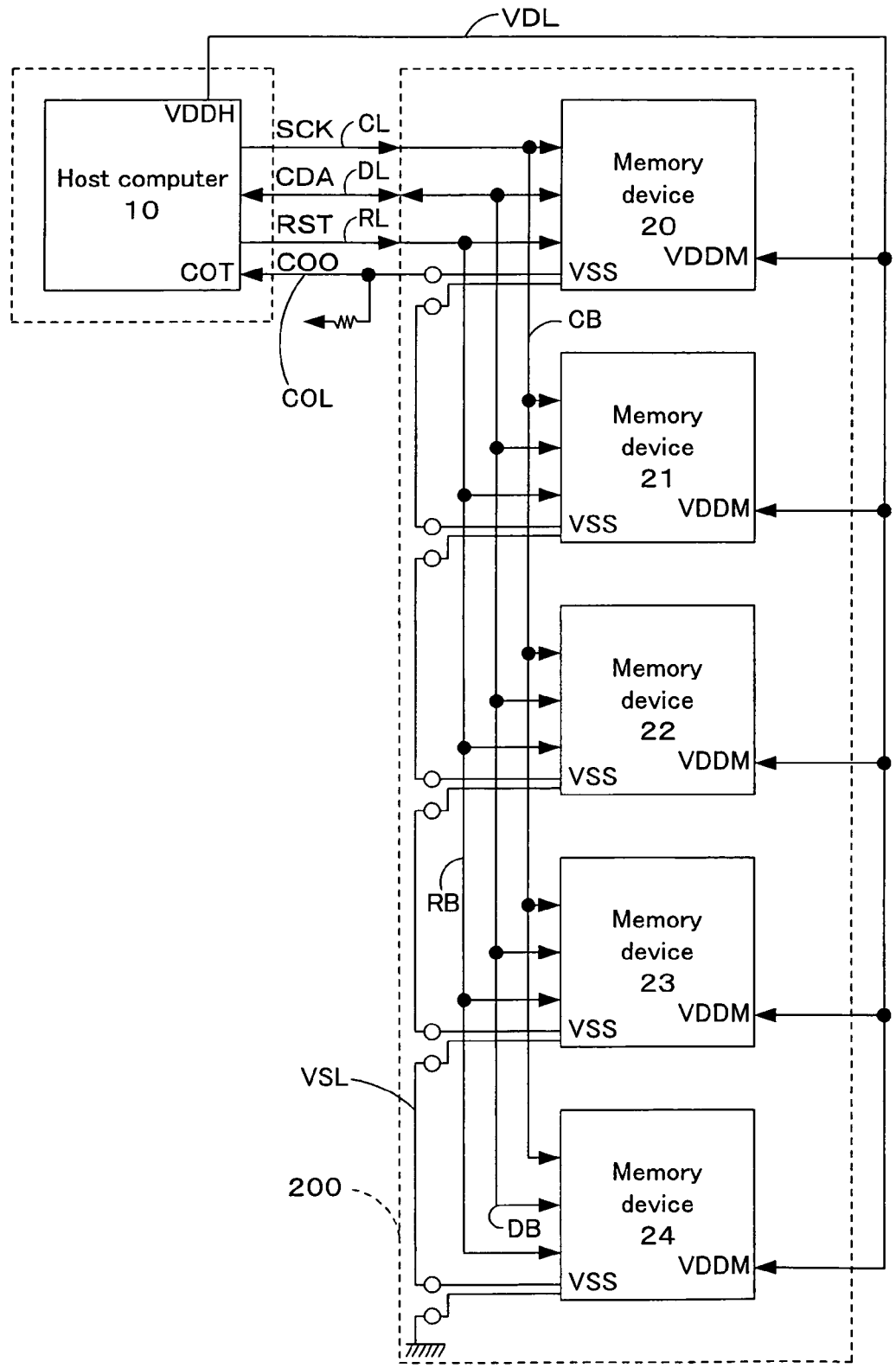
FIG. 1 is an illustration of a configuration example of a memory system comprising a host computer and a plurality of memory devices pertaining to the embodiment.

A. Memory System Configuration:

The general configuration of a memory system comprising the memory device of the invention will be described conceptually with reference to FIG. 1. FIG. 1 is an illustration of a configuration example of a memory system comprising a host computer and a plurality of memory devices pertaining to the embodiment.

Figure 11:
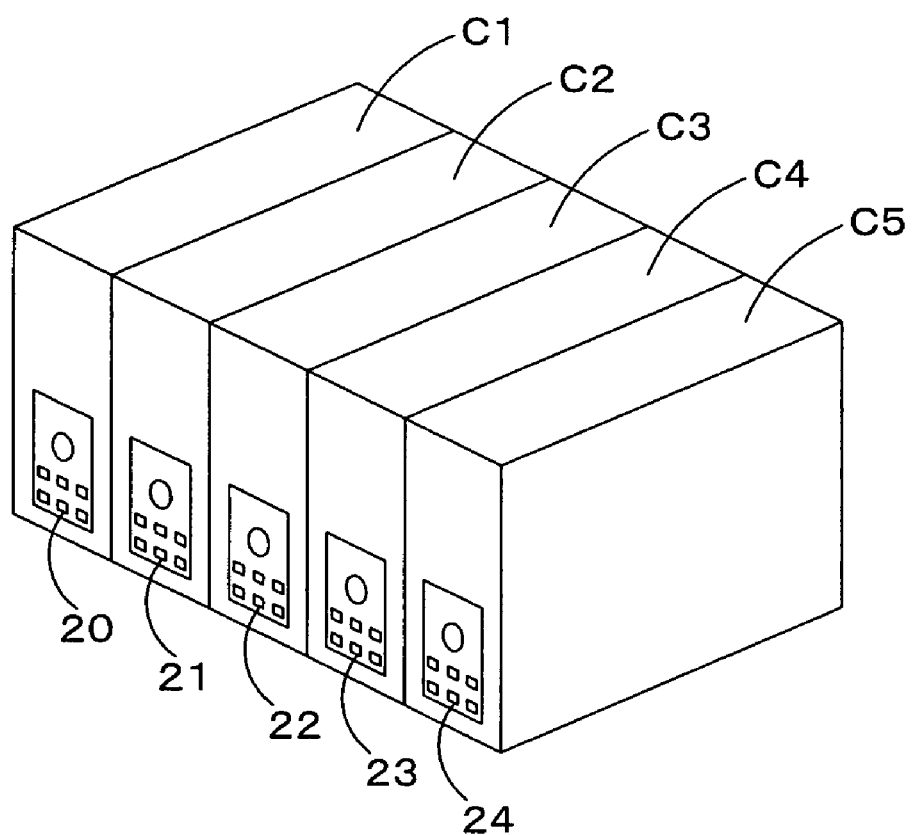
FIG. 11 is an illustration of an example of the memory device of the embodiment implemented in an ink cartridge.

The memory system pertaining to the embodiment comprises a host computer 10, and five memory devices 20, 21, 22, 23, 24 arrayed on a memory module board 200 and to which access is controlled by the host computer 10. As shown in FIG. 11, the memory devices 20, 21, 22, 23, 24 are provided respectively to ink cartridges C1, C2, C3, C4, C5 containing five colors of ink for an ink-jet printer. The five ink cartridges C1, C2, C3, C4, C5 contain inks of the colors cyan, light cyan, magenta, light magenta, and yellow, for example. The memory devices in the embodiment consist of EEPROM providing nonvolatile storage of memory contents, and accessed sequentially in one-bit units starting from the head address.

To simplify description, only the memory devices 20, 21, 22, 23, 24 are depicted in FIG. 1; however as noted, in actual practice the memory devices 20, 21, 22, 23, 24 of the embodiment are furnished to the ink cartridges C1, C2, C3, C4, C5.

Figure 4:
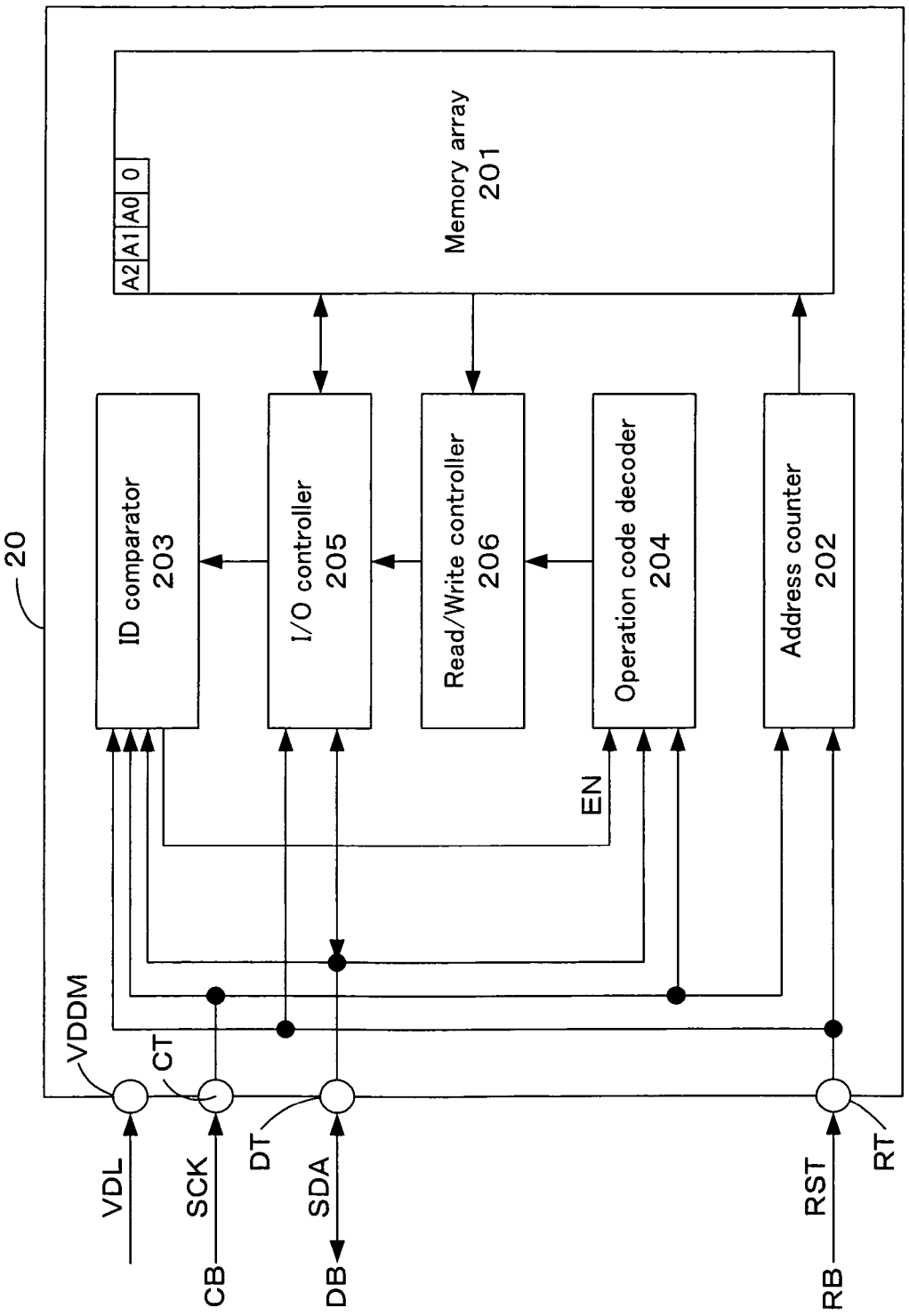
FIG. 4 is a block diagram of the internal circuit configuration of a memory device according to the embodiment.

The data signal terminal DT, clock signal terminal CT, and reset signal terminal RT of each of the memory devices 20, 21, 22, 23, 24 are connected respectively through a data bus DB, a clock bus CB, and a reset bus RB (see FIG. 4). The host computer 10 is connected with the data bus DB, clock bus CB, and reset bus RB through a data signal line DL, a clock signal line CL, and a reset signal line RL. These signal lines may employ flexible feed cable (FFC), for example. The positive power supply terminal VDDH of the host computer 10 and the positive power supply terminals VDDM of the memory devices 20, 21, 22, 23, 24 are connected through a power supply line VDL. On the memory module board 200 is disposed a negative power supply line VSL serially connecting the negative power supply terminals VSS of the memory devices 20, 21, 22, 23, 24. One end of the negative power supply line VSL is grounded, while the other end is connected to a cartridge out sensor terminal COT of the host computer 10 via a cartridge out signal line COT.

The host computer 10 is a control device having internally a clock signal generating circuit, a reset signal generating circuit, a power supply monitoring circuit, a power supply circuit, a power supply compensating circuit, a data memory circuit, and a control circuit for controlling the various circuits (not shown); it controls access to the memory devices 20, 21, 22, 23, 24. The host computer 10 is situated, for example, on the ink-jet printer unit side; it acquires data such as ink consumption level and ink cartridge installation time, and stores this data.

The control circuit of the host computer 10 performs access to the memory devices 20, 21, 22, 23, 24 when the ink-jet printer is powered on, when an ink cartridge is replaced, when a print job is finished, or when the ink-jet printer is powered off, for example. When the control circuit of the host computer 10 wishes to access the memory device 20, 21, 22, 23, or 24, it requests the reset signal generating circuit to generate a reset signal RST. Consequently, a reset signal RST is also generated in the event of a power interruption or if the power cord is unplugged. The power supply compensating circuit of the host computer 10 supplies power for a prescribed time interval (e.g. 0.3 s) in the event that the power has been shut off. The power supply compensating circuit may consist of a capacitor, for example.

The control circuit of the host computer 10, by controlling the power supply circuit, controls output of positive supply voltage. The host computer 10 of the embodiment does not supply steady power to the memory devices 20, 21, 22, 23, 24; positive power supply voltage is supplied to the memory device 20, 21, 22, 23, or 24 only when there is an access request to the memory device 20, 21, 22, 23, or 24.

Figure 2:
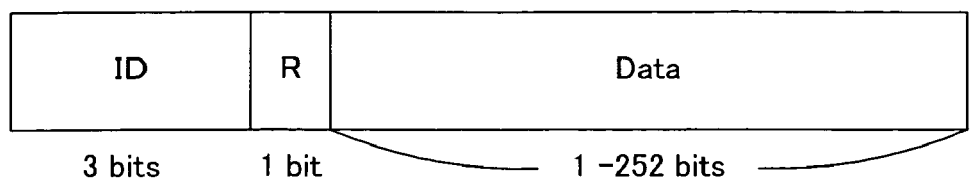
FIG. 2 is an illustration depicting an example of a data sequence sent from a host computer under normal circumstances.
Figure 3:
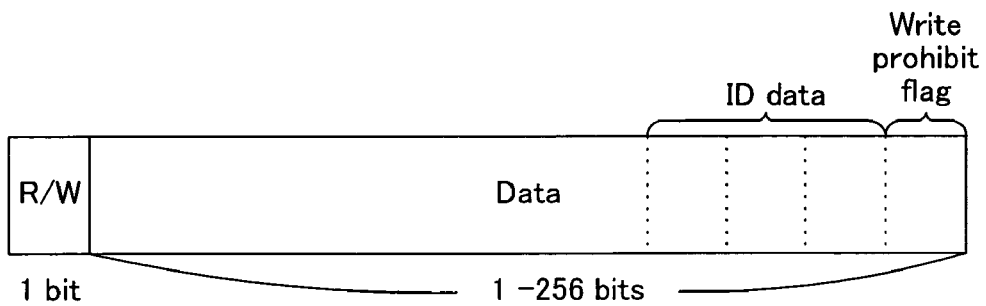
FIG. 3 is an illustration depicting an example of a data sequence sent from the host computer when writing to a memory device at the time of shipment from the factory.

Data sequences sent from the host computer 10 will be described with reference to FIG. 2 and FIG. 3. FIG. 2 is an illustration depicting an example of a data sequence sent from the host computer 10 under normal circumstances. FIG. 3 is an illustration depicting an example of a data sequence sent from the host computer when writing to a memory device at the time of shipment from the factory.

As depicted in FIG. 2, under normal circumstances, a data sequence sent from the host computer 10 will consist of a 3-bit identifying data portion, a 1-bit read/write command portion, and a 1-bit-252-bit write/read data storage portion. When writing data at the time of shipment from the factory, on the other hand, the data sequence sent from the host computer 10 for setting purposes will consist of a 1-bit write command portion and a 1-bit-256-bit write data storage portion as shown in FIG. 3. During a write operation, since writing commences from the fifth bit following the lead bit (the fifth address), identifying data is placed on the first three bits of the final four bits of the write data portion, while access control information indicating whether writing to the memory array 201 is enabled or disabled is placed on the last bit of these final four bits. As will be discussed later, the memory devices 20-24 pertaining to the embodiment store access control information indicating whether writing to the memory array is enabled or disabled, this information being stored on the fourth bit following the lead bit (fourth address) of the memory array. This access control information, together with write data (stored data), is stored in the memory array during writing of data prior to shipment from the factory. The access control information, when "0," may signify that write operations are prohibited (i.e. read-only), and when "1" that write operations are enabled. By having a data value of "0" signify that write operations are prohibited, writing to a memory device in error due to corrupted data may be avoided. Specifically, since memory device typically represents a data value of "1" by storing a charge in a memory cell of the memory device, it is highly likely that a data value of "0" could become a data value of "1" due to noise, for example; however, it is exceedingly rare for the opposite to occur.

When data is to be read out from the memory device 20, 21, 22, 23, or 24, the clock signal generating circuit of the host computer 10 generates a clock signal SCK at intervals of 4 μS for example; during a data write operation, it generates a clock signal SCK at 3 ms intervals.

B. Configuration of Memory Device Pertaining to the Embodiment

Next, the internal configuration of the memory devices 20, 21, 22, 23, 24 will be described with reference to FIG. 4. FIG. 4 is a block diagram of the internal circuit configuration of a memory device 20. Since the internal configuration of each of the memory devices 20, 21, 22, 23, 24 is identical except for the identifying information (identifying data) and unique data stored therein, in the following description, the internal configuration of the memory device 20 shall be described as representative.

The memory device 20 comprises a memory array 201, an address counter 202, an ID comparator 203, an operation code decoder 204, an I/O controller 205, and a read/write controller 206.

The memory array 201 has a memory area of prescribed capacity, e.g. 256 bits; identifying information is stored in a 3-bit memory area starting from the lead bit (i.e. up to the third address), while access control information for prohibiting write operations to the memory array 201 is stored at a memory area on the fourth bit following the lead bit (i.e. the fourth address). In the embodiment, at the time of shipment from the factory access control information for prohibiting write operations to the memory array 201 is stored for the purpose of preventing subsequent inadvertent writing to the memory devices 20-24. As noted, normally, the lead three bits of a data sequence sent from the host computer 10 store identifying data, while the fourth bit following the lead bit stores a write/read command. Consequently, data may only be written to a memory area starting from the fifth bit (fifth address) following the lead bit; by furnishing the memory array 201 with such a configuration, the lead four bits (lead four addresses) constitute a read-only memory area. Where addresses start from "0," the address "0" will be assigned to the first address or first bit; whereas if addresses start from "1," the address "1" will be assigned to the first address or first bit.

The address counter 202 is a circuit that increments the counter value in sync with the clock signal SCK input to the clock signal terminal CT, and is connected to the memory array 201. Counter values are associated with memory area locations (addresses) in the memory array 201, so that write locations or read locations may be identified by counter values of the address counter 202. The address counter 202 is also connected to the reset signal terminal RT, and when a reset signal RST is input, the counter value is reset to its initial value. Here, the initial value may be any value associated with the lead location of the memory array 201; typically, an initial value of "0" is used.

The ID comparator 203 is connected to the clock signal terminal CT, the data signal terminal DT, and the reset signal terminal RT; it decides whether identifying data stored in the memory array 201 matches the identifying data contained in a data sequence input via the data signal terminal DT. In greater detail, the ID comparator 203 acquires data (i.e. identifying data) equivalent to the three bits input subsequent to input of a reset signal RST. The ID comparator 203 has a 3-bit register (not shown) for storing identifying data contained in data sequences, and a 3-bit register (not shown) for storing identifying data acquired from the memory array 201 via the I/O controller 205; it decides whether these identifying data match by determining whether the values in the two registers match. In the event that the identifying data match, the ID comparator 203 sends an access enable signal EN to the operation code decoder 204. When a reset signal RST is input, the ID comparator 203 clears the register values. The ID comparator 203 of the memory device 20 and of all of the other memory devices 21, 22, 23, 24 also store common identifying data; in the embodiment, for example, (1, 1, 1) is stored. Since the ID comparator 203 of each memory device 20, 21, 22, 23, 24 has this common identifying data, data write operations intended to write in common to each memory device 20, 21, 22, 23, 24 may be executed simultaneously.

The operation code decoder 204 is connected to the ID comparator 203, the read/write controller 206, the clock signal terminal CT, and the data signal terminal DT. From a data sequence input from the data signal terminal DT, the operation code decoder 204 will acquire data (i.e. read/write command data) of the fourth bit input subsequent to input of the reset signal RST. If an access enable signal EN is input form the ID comparator 203, the operation code decoder 204 will parse the acquired read/write command, and send a write process request or a read process request to the read/write controller 206.

The I/O controller 205 is connected to the data signal terminal DT and the memory array 201; in accordance with a request from the read/write controller 206, it performs control to switch the data transfer direction with respect to the memory array 201 and the data transfer direction with respect to the data signal terminal DT (i.e. of the line connected with the data signal terminal DT). The I/O controller 205 is also connected to the reset terminal RT to receive reset signals RST. The I/O controller 205 comprises a first buffer memory (not shown) for temporary storage of data read from the memory array 201 and data for writing to the memory array 201, and a second buffer memory (not shown) for temporary storage of data from the data bus DB and data destined for the data bus DB.

The I/O controller 205 is initialized through input of a reset signal RST; during initialization, it sets the data transfer direction with respect to the memory array 201 to the read direction, and brings the signal line connected to the data signal terminal DT to high impedance to prohibit data transfer to the data signal terminal DT. This state during initialization is maintained until a write process request or a read process request is input from the read/write controller 206. As will be discussed later, input of a write process request or a read process request from the read/write controller 206 takes place after completion of a write decision process using the data of the fourth bit of a data sequence. Consequently, after a reset signal is input, data of four bits starting from the lead bit of a data sequence input via the data signal terminal DT will not be written to the memory array 201. The data stored on the lead four bits of the memory array 201 is sent to the ID comparator 203. As a result, the lead four bits of the memory array 201 (lead to fourth addresses) are read-only.

The read/write controller 206 is connected to the operation code decoder 204, the I/O controller 205, and the memory array 201. Upon input of a write process request from the operation code decoder 204, the read/write controller 206 decides whether it is possible to write to the memory array 201. To describe in greater detail, the read/write controller 206 accesses the fourth address from the lead, and determines whether there is stored there an access control code indicating that write operations are prohibited, i.e. whether a "0" is recorded in the fourth address from the lead. In the event that an access control code indicating that write operations are prohibited is stored there, the read/write controller 206 will discard the write process request from the operation code decoder 204, without forwarding it to the I/O controller 205.

In the event that an access control code indicating that write operations are enabled is stored, the read/write controller 206 will forward the write process request from the operation code decoder 204 to the I/O controller 205. Where the input from the operation code decoder 204 is a read process request, the read/write controller 206 will transfer the read process request to the I/O controller 205 without first determining whether an access control code indicating that write operations are prohibited is stored in the memory array 201. The operation code decoder 204, I/O controller 205, and read/write controller 206 may be realized by single functional circuit serving as the access control means.

C. Operation of Memory System

Figure 5:
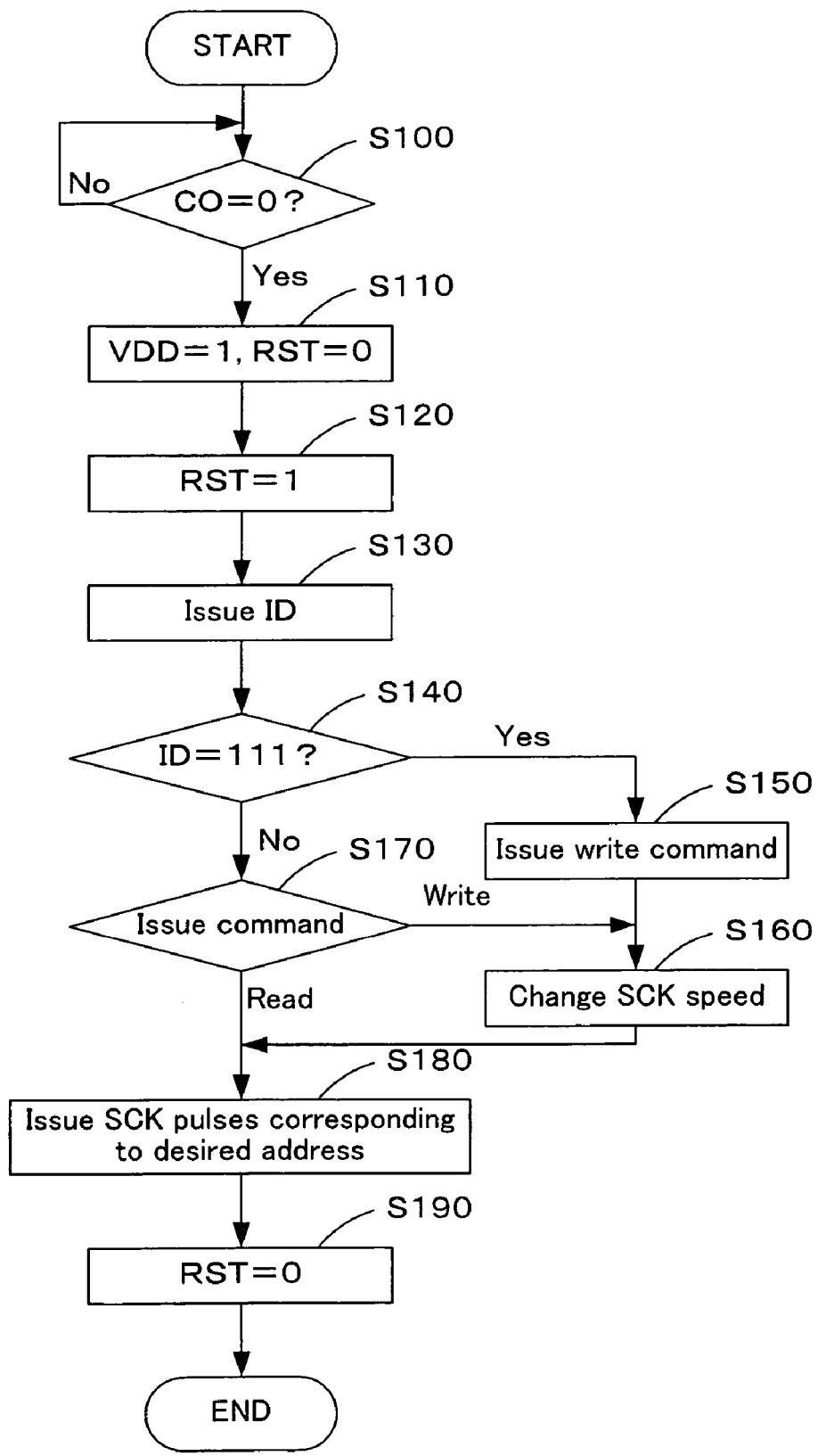
FIG. 5 is a flowchart depicting the processing routine executed by the host computer when accessing a memory device.
Figure 6:
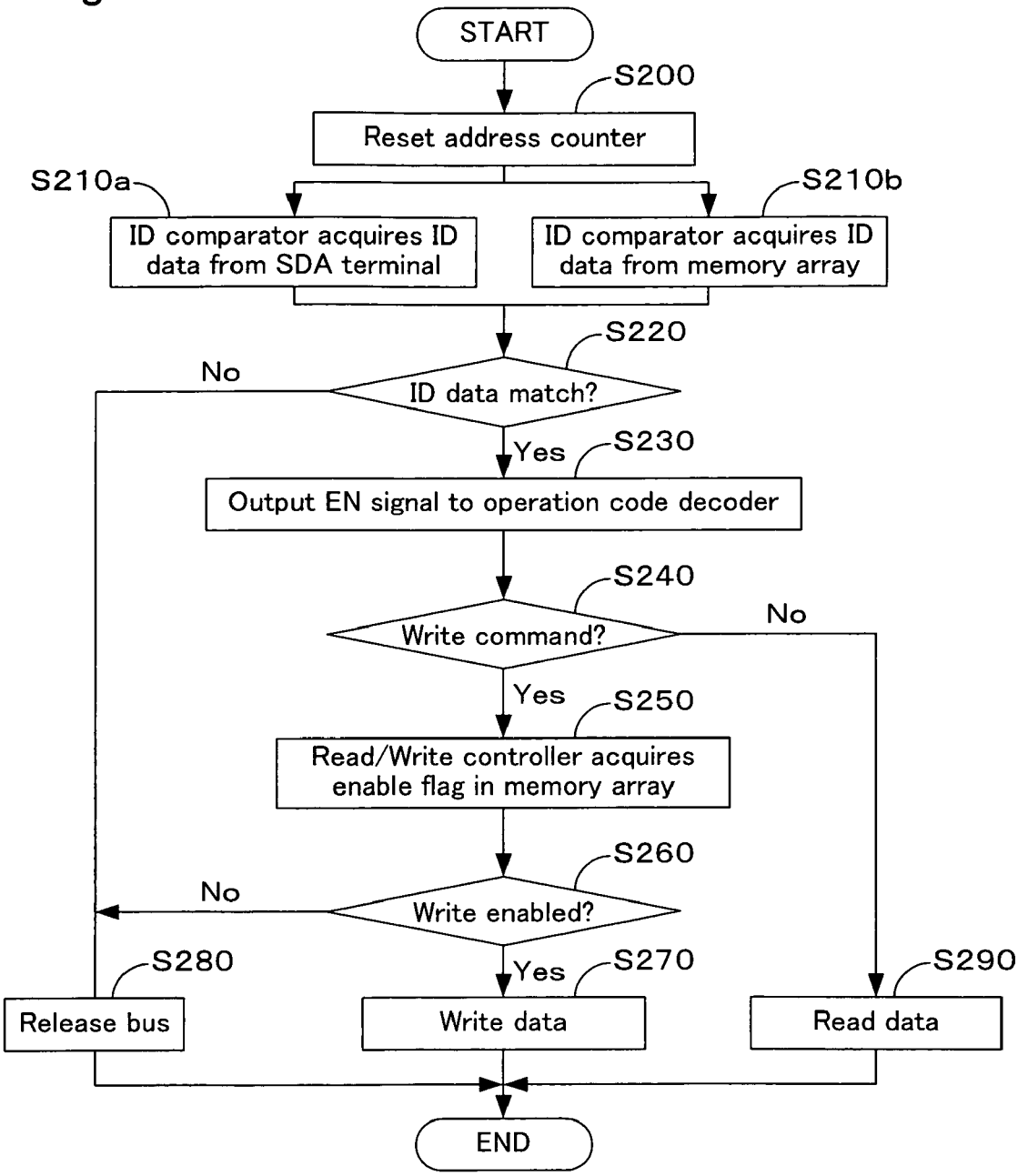
FIG. 6 is a flowchart depicting the processing routine executed by the constituent circuits of a memory device when being accessed by the host computer.
Figure 7:
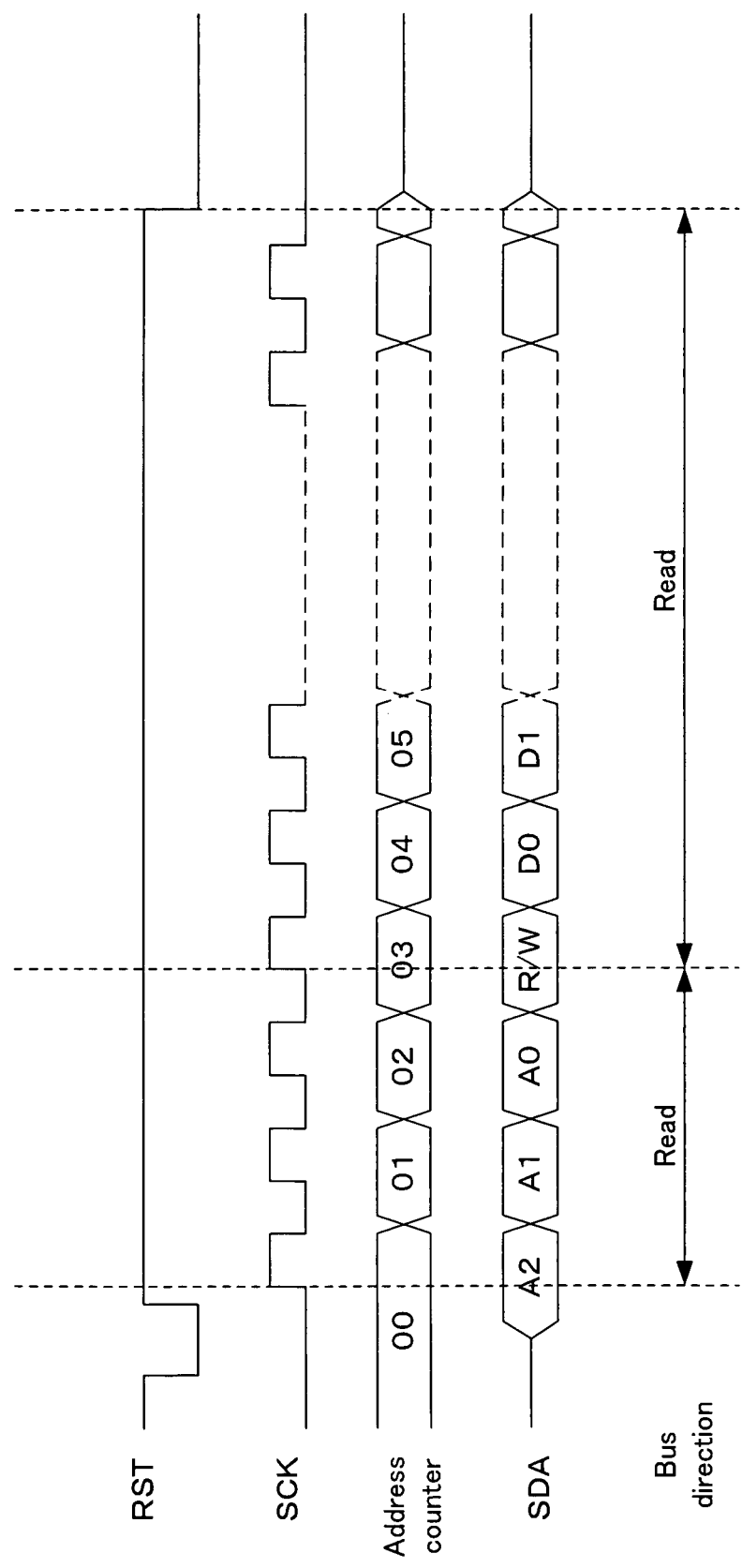
FIG. 7 is a timing chart depicting temporal relationships of the reset signal RST, clock signal SCK, data signal CDA, and address counter value during data reading.
Figure 8:
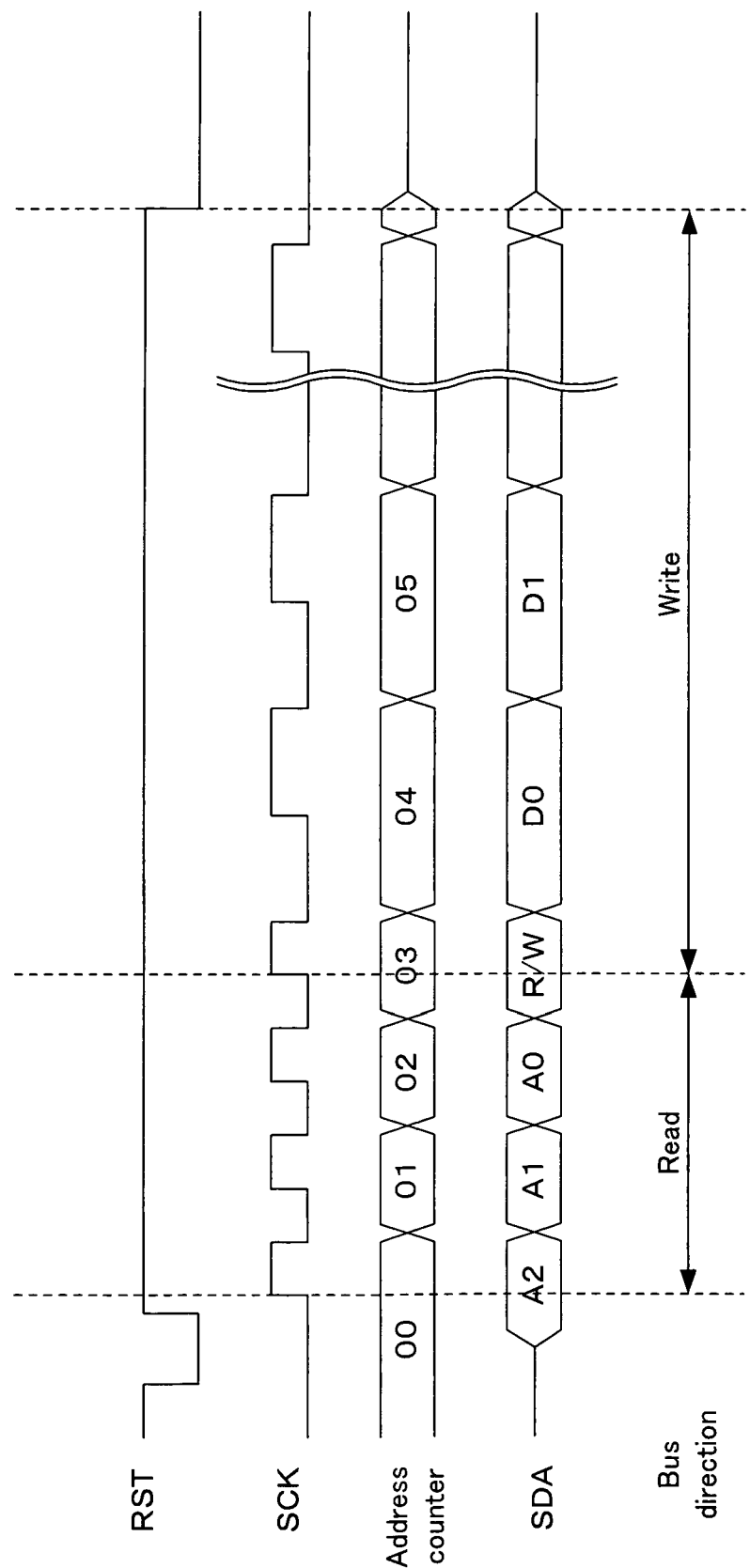
FIG. 8 is a timing chart depicting temporal relationships of the reset signal RST, clock signal SCK, data signal CDA, and address counter value during data writing.

The operation of the memory system in the embodiment will be described with reference to FIGS. 5-8. FIG. 5 is a flowchart depicting the processing routine executed by the host computer when accessing a memory device 20, 21, 22, 23, 24. FIG. 6 is a flowchart depicting the processing routine executed by the constituent circuits of a memory device 20, 21, 22, 23, 24 when being accessed by the host computer 10. FIG. 7 is a timing chart depicting temporal relationships of the reset signal RST, clock signal SCK, data signal CDA, and address counter value during data reading. FIG. 8 is a timing chart depicting temporal relationships of the reset signal RST, clock signal SCK, data signal CDA, and address counter value during data writing.

The control circuit of the host computer 10 waits until the input value CO of the cartridge out signal line COL goes to 0 (Step S100: No). Specifically, in the event that all of the ink cartridges have been installed properly in the ink cartridge holder, the negative power supply line VSL will be serially connected and grounded, and therefore the input value CO of the cartridge out signal line COL will indicate ground voltage (e.g. about 0 volt). On the other hand, in the event that even one of the ink cartridges has not been installed properly in the ink cartridge holder, the negative power supply line VSL will not be serially connected, and accordingly not grounded; therefore a value corresponding to the circuit voltage of the control circuit will appear on the cartridge out signal line COL. In the embodiment, in order to eliminate the effects of noise and the like, the value is binarized on the basis of a prescribed threshold value. Accordingly, the input value of the cartridge out signal line COL may assume 0 or 1.

When the input value CO of the cartridge out signal line COL goes to 0 (Step S100: Yes), as depicted in FIG. 7 and FIG. 8, the control circuit of the host computer 10 presents power supply voltage to the positive power supply terminals VDDM of the memory devices 20, 21, 22, 23, 24 (VDD=1) via the power supply line VDL, and causes the reset signal generating circuit to generate a reset-low signal (setting RST=0), which is output to the reset bus RB via the reset signal line RL (Step S110). Specifically, the memory devices 20, 21, 22, 23, 24 will not be supplied with power supply voltage as long as the ink cartridges have been installed properly in the ink cartridge holder. The reset signal RST is active low, so unless indicated otherwise the terms "generation" or "input" of a reset signal RST refers herein to a reset low signal.

Next, as depicted in FIG. 7 and FIG. 8, the host computer 10 causes the reset signal generating circuit to set the reset signal to high, i.e. RST=1 (Step S120). The control circuit of the host computer 10 issues identifying data (ID data) for the ink cartridge (memory device 20, 21, 22, 23, or 24) to which access is desired (Step S130). As shown in FIG. 7 and FIG. 8, the issued ID data is transferred to the data bus DB via the data signal line DL, in sync with the rising edge of the clock signal SCK. The control circuit of the host computer 10 decides whether or not the issued ID data is (1, 1, 1) (Step S140). As noted previously, the ID data (1, 1, 1) is identifying data stored in advance in the ID comparators of all of the memory devices 20, 21, 22, 23, 24, and in the event that the issued ID data is (1, 1, 1), data may be written simultaneously to all of the memory devices 20, 21, 22, 23, 24.

In the event that the control circuit of the host computer 10 has determined that the ID data=(1, 1, 1) (Step S140: Yes), it issues a write command (Step S150). As depicted in FIG. 7 and FIG. 8, the issued write command is transferred to the data bus DB via the data signal line DL, in sync with the rising edge of the fourth clock signal SCK after the reset signal RST has been switched from low to high. The control circuit of the host computer 10 requests the clock signal generating circuit to slow down the clock signal SCK speed, that is, for a longer interval clock signal SCK generation interval (Step S160). The time needed to write data to EEPROM is about 3 ms for example, whereas the time needed to read data is about 4 µs for example. Consequently, during a data write operation, the time required is about 1000 times that required for reading data. In the embodiment, until the data write command is issued, the memory devices 20, 21, 22, 23, 24 are accessed at fast clock speed, but during a data write operation the clock signal speed is slowed down, thereby reducing access time, as well as attaining reliable data writing.

In the event that the control circuit of the host computer 10 has determined that the ID data is not (1, 1, 1) (Step S140: No), it issues either a read command (Read) or a Write command (Write) (Step S170). The issued command is sent to the data bus DB via the data signal line DL. In the event that the issued command is a Write command (Step S170: Write), the control circuit of the host computer 10 slows down the clock signal speed (Step S160). On the other hand, in the event that the issued command is a Read command (Step S170: Read) the clock signal is maintained unchanged.

The control circuit of the host computer 10 issues clock signal pulses in a number corresponding to the address (location) of the memory array 201 to which it is desired to write (Step S180). Specifically, since the memory device 20 in the embodiment is memory device of sequential access type, it is necessary that clock signal pulses be issued in a number corresponding to the address to which it is desired to write, and the counter value of the address counter 202 is incremented until reaching the count value corresponding to the prescribed address. Finally, the control circuit of the host computer 10 causes the reset signal generating circuit to generate a reset low signal (set RST=0) which is sent to the reset bus RB via the reset signal line RL to terminate access to the memory devices 20, 21, 22, 23, 24. In this way, access is terminated by sending of a reset signal RST (reset low signal), and since a reset signal RST is sent during power shutoff as well, the process of writing data for which writing has finished may be terminated normally, even if the power is shut off during data writing.

Next, the process executed by the constituent circuits of the memory devices 20, 21, 22, 23, 24 during access by the host computer 10 will be described with reference to FIG. 6. In the following description as well, the memory device 20 is described as representative.

When a reset low signal is input to the reset bus RB, the address counter 202 resets the counter value to the initial value (0) (Step S200). The ID comparator 203 and the I/O controller 205 are initialized as well. Specifically, the two registers in the ID comparator 203 are cleared, and the I/O converter 205 sets the data transfer direction with respect to the memory array 201 to the read direction, as well as bringing the signal line connected to the data signal terminal DT to high impedance to prohibit data transfer.

As noted, when the reset signal RST is switched from low to high, the host computer 10 transmits the various kinds of data, in sync with the rising edge of the clock signal SCK. Similarly, when the reset signal RST is switched from low to high, the address counter 202 increments the counter value in increments of 1 from the initial value, in sync with the rising edge of the clock signal SCK.

In sync with the rising edge of the third clock signal SCK after the reset signal RST has been switched from low to high, the ID comparator 203 acquires the data sent by the data bus DB, i.e. the 3-bit ID data, and stores it in the first 3-bit register (Step S210a). At the same time, the ID comparator 203 acquires data from the addresses in the memory array 201 specified by the counter values 00, 01, 02 of the address counter 202 (Step S220b). Specifically, it acquires the identifying data stored at the first to third addresses (memory cells, memory areas) of the memory array 201, and places it in the second 3-bit register.

The ID comparator 203 then decides whether the ID data (identifying data) stored in the first and second registers match (Step S220). The ID comparator 203 also decides whether the common ID data it already possesses matches the ID data stored in the first register. In the event that the ID comparator 203 decides that these ID data do not match (Step S200: No.), it requests the I/O controller 205 to release the data bus. The I/O controller 205 having received the request releases the bus (Step S270) and terminates the routine. That is, the access process in the memory device 20 terminates without allowing access to the memory array 201 by the host computer 10. In this case, access to any of the other memory devices 21, 22, 23, 24 will be permitted.

If on the other hand the ID comparator 203 decides that the ID data match (Step S220: Yes), it sends an access enable signal EN to the operation code decoder 204 (Step S230). In this case, of the plurality of memory devices 20, 21, 22, 23, 24, access will be allowed to the memory device 20 only, or where the ID data is (1, 1, 1), to all of the memory devices 20, 21, 22, 23, 24. In sync with the rising edge of the fourth clock signal SCK after the reset signal RST has been switched from low to high, the operation code decoder 204 having received the access enable signal EN acquires the write/read command sent from the data bus, and decodes the command (Step S250).

The operation code decoder 204 sends the decoded write/read command to the read/write controller 206. The read/write controller 206 decides whether the decoded command input from the operation code decoder 204 is a write command (Step S240). In the event that the read/write controller 206 decides it is a write command (Step S240: Yes), it acquires the access control information from the fourth address following the head address of the memory array 201 (Step S250).

The read/write controller 206 now decides whether writing to the memory array 201 is possible (Step S260). Specifically, the read/write controller 206 decides whether the acquired access control information indicates that writing is prohibited, i.e. whether it is "0." In the event that the read/write controller 206 decides that writing to the memory array 201 is possible, that is, that the acquired access control information does not indicate that writing is prohibited (indicates that writing is enabled) (Step S260:Yes), it sends to the I/O controller 205 the write command received from the operation code decoder 204.

The I/O controller 205 having received the write command changes the data transfer direction with respect to the memory array 201 to the write direction, and cancels the high impedance setting of the signal line connected to the data terminal DT so as to permit data transfer (Step S270). In this state, write data sent to the data bus will be stored sequentially in 1-bit increments at addresses (locations) in the memory array 201 specified by the counter value of the address counter 202, which counts up sequentially in sync with the clock signal SCK. Since the data storage area 20 pertaining to the embodiment is sequentially accessed in this way, write data sent from the host computer 10 will have the same value (i.e. 0 or 1) as the data currently stored in the memory array 201, except for data corresponding to addresses it is desired to rewrite. That is, data at addresses not to be rewritten in the memory array 201 are overwritten with identical values.

In the event that the read/write controller 206 decides that writing to the memory array 201 is not possible, i.e. that the acquired access control information indicates that writing is prohibited (Step S260: No), it does not send the write command received from the operation code decoder 204 to the I/O controller 205. The read/write controller 206 requests the I/O controller 205 to release the data bus, whereupon the I/O controller 205 releases the bus and terminates the routine (Step S280).

In the event that the read/write controller 206 decides that the command is not a write command (Step S240: No), it sends to the I/O controller 205 the read command received from the operation code decoder 204. The I/O controller 205 having received the read command changes the data transfer direction with respect to the memory array 201 to the read direction, and cancels the high impedance setting of the signal line connected to the data terminal DT so as to permit data transfer (Step S290). In this state, data stored in the memory array 201 will be read out sequentially from addresses (locations) specified by the counter value of the address counter 202, which counts up sequentially in sync with the clock signal SCK, and will be sequentially overwritten into the first buffer memory of the I/O controller 205.

Specifically, only the data of the address read out last (the data of the address location specified by the host computer 10) is held in the second buffer memory of the I/O controller 205. The I/O controller 205 sends the read data held in the second buffer memory to the data bus DB via the data terminal DT, for transfer to the host computer 10.

Finally, when a reset low signal is input, the address counter 202, the ID comparator 203, and the I/O controller 205 are initialized, and the data write or read process terminates. The read or write data is confirmed in 1-bit units, and re-input of a reset low signal is not an operation required to confirm the data.

Figure 9:
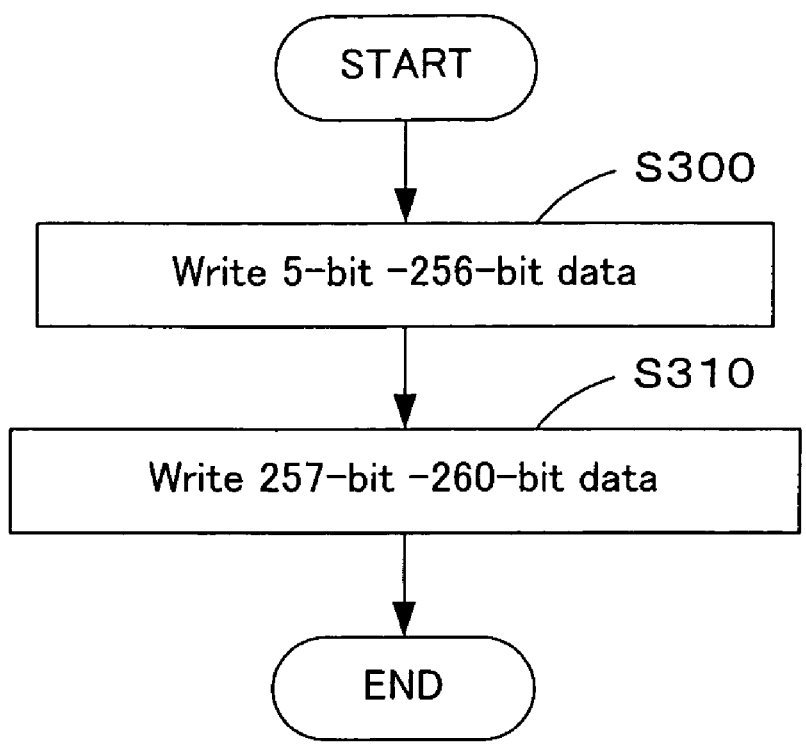
FIG. 9 is a flowchart depicting the flow of the data write process to a memory device at the time of shipment from the factory.
Figure 10:
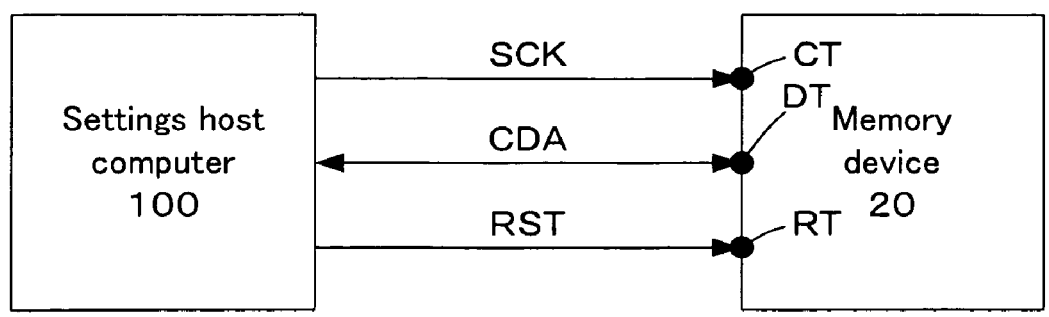
FIG. 10 is an illustration of connections between a memory device and a host computer used for making settings when performing a data write at the time of shipment from the factory.

D. Writing of Data to Memory Devices at Shipment from Factory:

Next, the process of writing data to the memory devices 20-24 at the time of shipment from the factory will be described with reference to FIG. 9 and FIG. 10. FIG. 9 is a flowchart depicting the flow of the data write process to a memory device at the time of shipment from the factory. FIG. 10 is an illustration of connections between a memory device and a host computer used for making settings when performing a data write at the time of shipment from the factory.

The following process is executed with the memory device 20 installed on an ink cartridge during ink cartridge manufacture, by one-to-one connection of signal lines from the host computer 100 (or a dedicated settings host computer) to the terminals CT, DR, RT (probes) of the memory device 20 as depicted in FIG. 10.

Data values of "1" are stored in the lead four bits or the entire memory area of the memory array 201 of the memory device 20 used at this time. First, the settings host computer 100 issues the ID data [1, 1, 1], and an access enable signal EN is output from the ID comparator 203 to the operation code decoder 204.

When the settings host computer 100 detects the access enable signal EN from the ID comparator 203, it writes data equal in capacity to the capacity of the memory array 201 to the memory array 201 (S300). As described with reference to FIG. 3, the data sequence sent from the settings host computer 10 describes a write process command on its lead bits and describes data on its fifth and subsequent bits; and of the final four bits, identifying information is described on the initial 3 bits, with access control information described on the last bit of the final 4 bits.

In this embodiment, the memory array 201 has a capacity of 256 bits from address 0 (1) to address 255 (256) each assigned 1-bit capacity. Consequently, in Step S300, 252-bit data of 252-bit is written onto the fifth bit (fifth address) through the 256th bit (256th address) to which writing is possible.

The settings host computer 100 then writes 3-bit data (identifying data) onto the 257th-259th bits, and 1-bit data (access control information) onto the 260th bit of the memory array 201 (Step S310), then terminates the routine. Specifically, since writing has already been completed up through the 256th bit of the addresses of the memory array 201, new data for writing will be written to the first to third bits (first to third addresses) and to the fourth bit (fourth address), from the lead of the memory array 201. As a result, identifying data is written to the lead three bits of the memory array 201, while access control information prohibiting writing of data to the memory array 201 is written to the fourth bit from the lead.

As described hereinabove, according to the memory device and memory system of the embodiment, the decision as to whether writing to the memory device 20 is possible is made using access control information stored on the fourth bit from the lead in the memory array 201, whereby it may be quickly determined whether writing to the memory device 20 is possible. Since the decision as to whether write operations to the memory device 20 are enabled or disabled is made without accessing the data storage area starting from the fifth bit from the lead in the memory device 20 (memory array 201), inadvertent overwriting of data stored in the data storage area may be minimized or prevented. Consequently, reliability of data stored in the memory device 20 may be improved.

Additionally, since decisions as to whether access or write operations to the memory device 20 are enabled or disabled may be made using data on the lead four bits in the memory device 20, in a memory system comprising a plurality of memory devices 20-24, it is possible to quickly identify a target memory device and to determine whether write operations to the identified memory device are enabled or disabled.

According to the method of making read-only of the embodiment, once the memory device 20 has been installed on an ink cartridge and shipped, new write operations to the memory device 20 are prohibited, making the memory device 20 read-only. Specifically, write operations to the memory device 20 after the ink cartridge has been shipped from the factory may be prohibited. Consequently, it is possible to prevent overwriting of data relating to the ink, stored on the fifth and subsequent bits, as well as of identifying information.

E. Other Embodiments (1) In the preceding embodiment, access control information indicating whether data write operations to the memory device are enabled or disabled is stored on the fourth bit (fourth address) from the lead of the memory array 201, but could be stored at some other address, as long as the address precedes the data to be stored in the memory array 201. Nor is it necessary for identifying information to consist of three bits, the size of the identifying data being modifiable as appropriate depending on the number of memory devices to be identified. Nor is the capacity of the memory array 201 limited to 256 bits; it may be modified as appropriate depending on the amount of data to be stored.

(2) Whereas in the preceding embodiment, the use of EEPROM as the memory device 20 was described, the memory device is not limited to EEPROM, and may be implemented in an memory device capable of nonvolatile storage of stored data, and enabling the stored data to be made read-only.

(3) In the preceding embodiment, identifying data is stored on the lead three bits of the memory array 201, but the size of the identifying data may be modified appropriately depending on the number of memory devices to be identified. The capacity of the memory array 201 is not limited to 256 bits and may be modified as appropriate depending on the amount of data to be stored.

(4) Whereas the preceding embodiment described the case where five memory devices 20, 21, 22, 23, 24 are provided to (five) independent ink cartridges of five colors, the memory device 20 pertaining to the embodiment could instead be implemented for ink cartridges of two to four colors, or of six colors or more. Associations of identifying information and memory devices 20-24 are not limited to ink type or ink color; initial ink level stored in ink cartridges is acceptable as well.

(5) The preceding embodiment described the memory device 20 pertaining to the embodiment as a memory device for the purpose of storing ink cartridge information on ink cartridges for an ink-jet printer; however, the memory device 20 pertaining to the embodiment may be used in other forms as well. Specifically, in a system employing a plurality of memory devices, identifying data for the purpose of access to a particular memory device is stored on the lead three bits of the memory array 201, but the size of the identifying data may be modified appropriately depending on the number of memory devices to be identified. The capacity of the memory array 201 is not limited to 256 bits and may be modified as appropriate depending on the amount of data to be stored.

(6) With the memory device 20 in the write enabled state, a reset signal RST is output during power shutoff as well, so even if the power should be shut off accidentally during data writing, the process of writing data for which writing has been completed at that point may be terminated; and since in the embodiment data is written in one-bit units, problems such as data corruption of data writing of which has been completed may be avoided.

(7) During power shutoff, the power supply compensating circuit supplies supplemental power for a prescribed time interval, and during data write operations, writing proceeds sequentially from write priority data, namely, remaining ink level or consumed ink level. Consequently, in the event that it is necessary to write to a number of memory devices 20, 21, 22, 23, 24, writing of write priority data may be completed to all of the memory devices.

While the memory device, memory system, and method of making a memory device read-only pertaining to the invention have been shown herein based on certain preferred embodiments, the embodiments set forth herein are merely intended to facilitate understanding of the invention, and should not be construed as limiting thereof. Various modifications and improvements to the invention are possible without departing from the spirit and scope thereof as set forth in the claims, and these shall be deemed to be included among the equivalents of the invention.

The invention claimed is:

1. A memory device accessed sequentially starting from a head address, comprising:
    a nonvolatile memory array that stores at an address accessed prior to the data storage start address access control information indicating whether data write operations to the memory device are enabled or disabled;
    a receiving module that receives an access request that includes either a write request or a read request to the memory array; and
    an access control module that, in the event that the access request is a write request to the memory array, refers to the access control information in the memory array, and in the event that write operations are not allowed, does not execute the received access request.

2. The memory device according to claim 1 wherein
    the address at which the access control information is stored is the fourth address after the head address; and
    the access control module comprises:
    an input/output control module that performs writing of data to the memory array and reading of data from the memory array;
    a command decoder that parses write/read commands contained in access requests input via the receiving module; and
    a read/write control module that, in the event that the command parse result by the command decoder is a write command, refers to the access control information in the memory array, and in the event that write operations are not allowed, does not send the received write command to the input/output control module.

3. The memory device according to claim 2 wherein
the memory array stores at up to the third address starting from the head address identifying information for the purpose of identifying the memory device;
the access request further includes memory device identifying information specifying the memory device; and
the memory device further comprises
an ID comparator that acquires the identifying information from the memory array and decides whether the acquired identifying information matches the memory device identifying information contained in the received access request; wherein in the event that the identifying information matches the memory device identifying information, the ID comparator sends to the command decoder an enable signal enabling parsing of the command contained in the access request.

4. The memory device according to claim 3 wherein
the receiving module comprises:
a clock signal terminal that receives a clock signal for identifying an address in the memory array;
a data terminal for data input and output; and
a reset signal terminal that receives a reset signal; and
the memory device further comprises:
a data bus connected to the data terminal; and
an address counter that counts up a counter value in sync with the received clock signal, identifying addresses in the memory array; and that resets the counter value to an initial value during initialization.

5. A memory device accessed sequentially starting from a head address, comprising:
a nonvolatile memory array that stores at up to the third address starting from the head address identifying information for identifying the memory device, and storing at the fourth address following the head address access control information indicating whether data write operations to the memory device are enabled or disabled;
a clock signal terminal that receives a clock signal for identifying an address in the memory array;
a data terminal for input and output of a data sequence;
a reset signal terminal that receives a reset signal;
a data bus connected to the data terminal;
an address counter that counts up a counter value in sync with the received clock signal, identifying addresses in the memory array, and that resets the counter value to an initial value during initialization;
an ID comparator connected to the data bus, that decides whether memory device identifying information contained in the data sequence matches identifying information stored in the memory array, wherein in the event that the memory device identifying information matches the identifying information, the ID comparator outputs an enable signal enabling parsing of the command contained in the data sequence;
an input/output control device located between the memory array and the data terminal, that in response to the received command controls the direction of data transfer with respect to the memory array and the direction of data transfer with respect to the data bus, and that until receiving the command, sets the direction of data transfer with respect to the memory array to the data read direction, and blocks connection to the data bus;
a command decoder connected to the data bus and the ID comparator, that upon having received the enable signal from the ID comparator, parses the command contained the data sequence; and
a read/write control module that, in the event that the command parse result by the command decoder is a write command, refers to the access control information in the memory array, and in the event that write operations are not allowed, does not send the received write command to the input/output control module.

6. A print recording material receptacle comprising the memory device according to claim 1 or 5.

7. The print recording material receptacle according to claim 6 wherein
the print recording material receptacle comprises a memory device having identifying information corresponding to an ink type contained therein, wherein the identifying information is unique in the different ink types.

8. A memory device accessed sequentially in memory cell units starting from an access start location, comprising:
a nonvolatile memory array furnished with a plurality of memory cells, and storing in the three memory cells following the lead one identifying information for the purpose of identifying the memory device, while storing in the fourth memory cell following the lead one access control information indicating whether data write operations to the memory device are enabled or disabled;
a receiving module that receives an access request to the memory device; and
an access control module that, in the event that the access request contains a write request, refers to the access control information in the memory array, and in the event that write operations are not allowed, does not execute the received access request.

9. A method of making a nonvolatile memory device storing prescribed data read-only, the memory device having a sequentially accessed memory array, the method comprising:
detecting a reset signal in order to reset the counter value of an address counter to an initial value, while prohibiting countup of the counter value in sync with a clock signal;
on the basis of a write command sent to a data bus, setting the data transfer direction with respect to the data bus to the write direction, while setting the data transfer direction with respect to the memory array to the write direction;
upon completion of setting of the data transfer direction, permitting countup of the counter value in the address counter in sync with the clock signal; and
in accordance with the count value of the address counter, writing data starting from the next address following the head address in a prescribed sequence, while finally writing at an address in the prescribed sequence following the head address access control information that prohibits further write operations to the memory array.

10. The method according to claim 9 wherein
the access control information is written to the fourth address following the head address; and
the method further comprises:
writing identifying information up to the third address starting from the head address of the memory array, in accordance with the count value in the address counter.

11. A method of making a nonvolatile memory device read-only, the memory device having a sequentially accessed memory array, and having stored at the fourth location following the lead location of a memory area of the memory array access control information indicating whether write operations are enabled or disabled, the method comprising:

searching for identifying information that matches the identifying information stored in the memory array of the memory device;

in the event that identifying information matching the identifying information stored in the memory array of the memory device is found, sending the found identifying information and a write command to the memory device;

following the write data corresponding to the end location of the memory area of the memory array, sending to the memory device a data sequence that contains the identifying information and access control information to the memory device; and in accordance with the count value in an address counter, writing data up to the end location of the memory area of the memory array, then writing access control information that prohibits further write operations, to the fourth location following the lead location of the memory area of the memory array.

12. A memory system comprising a plurality of nonvolatile memory devices bus-connected to a clock signal line, a data signal line, and a reset signal line; and a control device connected to memory devices via a clock signal line, a data signal line, and a reset signal line;

wherein the control device comprises:

a clock signal generating circuit;

a reset signal generating circuit that generates a reset signal for initializing the memory devices;

an identifying information issuing circuit that issues identifying information corresponding to identifying information for a desired memory device among the plurality of memory devices; and a data transmission circuit that in sync with the generated clock signal, sends a data sequence containing the issued identifying information and a write/read command to the data signal line;

and each memory device comprises:

a data bus connected to the data signal line;

a memory array that is accessed sequentially, and that at a prescribed location following the lead location of the memory area stores access control information indicating whether data write operations are enabled or disabled;

an ID comparator connected to the data bus, that decides whether identifying information sent from the control device matches identifying information stored in the memory array;

an input/output control device located between the memory array and the data terminal, that in response to a received command controls data transfer with respect to the data bus and the memory array;

a command decoder connected to the data bus and the ID comparator comparing device, and that in the event of a determination that identifying information sent from the control device by the comparing device matches the identifying information stored in the memory array, parses the write/read command contained in the data sequence; and a read/write control module located between the input/output control device and the command decoder, and that in the event that the parsed command is a write command, refers to the access control information in the memory array, and in the event that write operations are not allowed, does not send the write command to the input/output control module.

13. The memory system according to claim 12, wherein memory device further comprises an address counter that counts up a counter value in sync with a clock signal input via the clock signal line, identifying a location to be accessed in a memory area of the memory cell; and that resets the counter value to an initial value during initialization; and during initialization the input/output control device sets the data transfer direction with respect to the memory array to the read direction and blocks data transfer with respect to the data bus, and maintains the initialization state unit parsing of the write/read command by the command decoder is complete.

* * * * *